(12) United States Patent
Penketh

(10) Patent No.: US 6,474,438 B1
(45) Date of Patent: Nov. 5, 2002

(54) POWER STEERING

(75) Inventor: David Michael Penketh, West Midlands (GB)

(73) Assignee: TRW LucasVarity Electric Steering Ltd., West Midland (GB)

( * ) Notice: Subject to any disclaimer, the term of this patent is extended or adjusted under 35 U.S.C. 154(b) by 0 days.

(21) Appl. No.: 09/831,333

(22) PCT Filed: Nov. 11, 1999

(86) PCT No.: PCT/GB99/03761

§ 371 (c)(1),
(2), (4) Date: Jul. 3, 2001

(87) PCT Pub. No.: WO00/27685

PCT Pub. Date: May 18, 2000

(30) Foreign Application Priority Data

Nov. 11, 1998 (GB) ............................................. 9824590

(51) Int. Cl.[7] ................................................. B62D 5/04
(52) U.S. Cl. ........................................ 180/444; 318/293
(58) Field of Search ................................. 180/443, 444, 180/446; 318/254, 256, 280, 287, 293, 139

(56) References Cited

U.S. PATENT DOCUMENTS

| 5,602,451 A | 2/1997 | Kohge et al. |
| 6,107,716 A | * 8/2000 | Penketh ....................... 180/443 |

FOREIGN PATENT DOCUMENTS

| JP | 1999-248564 | * 9/1999 |
| JP | 2001-106097 | * 4/2001 |

* cited by examiner

*Primary Examiner*—Kevin Hurley
(74) *Attorney, Agent, or Firm*—Tarolli, Sundheim, Covell, Tummino & Szabo L.L.P.

(57) ABSTRACT

In an electric power assisted steering system a power stage (2) is provided comprising at least a first conducting means (4), and a control stage (1) is provided comprising a second separate conducting means (5) adapted to carry one or more electrical components of a control circuit. Each conducting means comprising one or more conductive tracks or links (10) for carrying current to and/or from components of the electric power assisted steering system.

10 Claims, 3 Drawing Sheets

POWER STEERING

This invention relates to improvements in electric power assisted steering systems, and in particular to improvements in the arrangement of electrical circuitry in such systems.

Electric power assisted steering systems are well known in the art. A typical system comprises a first portion of shaft operatively connected to a steering wheel and a second portion of shaft operatively connected to a road wheel of the vehicle through, for example, a steering rack. A torque sensor provides an indication of the torque in the first portion of shaft, and produces an output signal dependent on that torque which is passed to an electrical circuit. The electrical circuit processes the output signal to produce a motor drive signal for a motor which is connected through a gearbox to the second portion of shaft. The motor drive signal corresponds to an assistance torque to be applied by the motor to the second portion of shaft to assist the driver of the vehicle, thus making the steering wheel easier to turn.

The electrical circuit comprises low power devices which modify the output signal from the torque sensor to produce the motor drive signal. This may typically comprise an electronic control unit comprising an integrated circuit or discrete components. The motor drive signal is then further processed by the circuit to produce one or more motor voltage current signals indicate of the current required in each phase of the electric motor. For a typical three phase motor, a pulse width modulation strategy can be employed to drive the motor, whereby the motor drive signal is converted into three motor phase voltage signals which control suitable high power switching circuitry to apply the appropriate voltage waveform to each motor phase. A capacitor may also be provided which is placed in the motor current path to enable a measurement of motor current to be made. The electronic and electrical circuitry can therefore be considered to be loosely divided into two stages. A first (control) stage comprises the low power components used to modify the torque sensor output signal and generate the appropriate motor drive signal (s). The second stage (power stage) comprises the high power electrical components and associated electrical conductors of the electrical switching stage, typically a bridge circuit of high power semiconductor switching devices, for example transistors, and the motor current sense resistor.

It is known in the art in electric power assisted steering systems of the kind set forth to provide both the control circuit and the power stage on a single printed circuit board.

We are also aware of U.S. Pat. No. 5,602,451 in which an electric power assisted steering system is disclosed having both low power components and high power components located on separate printed circuit boards.

In accordance with a first aspect, the invention provides an electric power assisted steering system of the kind which comprises a first portion adapted to be operatively connected to a steering wheel of a vehicle, a second portion adapted to be operatively connected to a road wheel, a torque sensor adapted to provide an output signal indicative of the torque in the first portion, and an electrical circuit adapted to process the output signal from the torque sensor to produce a drive signal for a motor connected through a gearbox to the second portion. in which the electrical circuit comprises a power stage which comprises at least a first conducting means and a control stage comprising a second separate conducting means adapted to carry one or more electrical components of a control circuit, each conducting means comprising one or more conductive tracks or links for carrying current to and/or from components of the electric power assisted steering system, and in which an electromagnetic shield is provided between the first and second conducting means.

Preferably, the first and second conducting means are arranged spaced apart one on top of the other, for example with an air gap therebetween.

By providing two separate stages, each comprising a separate conducting means, it is possible to reduce the cost of the control stage compared with a prior art system in which both the power and control components are provided on one conducting means as the power handling capability of the conducting tracks or links between the components of the control stage can be made lower than that of the tracks or links between components of the power stage.

By conducting means we mean a printed circuit board, lead frame or any other structure comprising a number of conducting tracks or connections adapted to link together one or more of the components of the respective stage to form a circuit and supported or joined by a non-electrically conducting material.

In a most preferred arrangement, the conducting track or connections of the power stage conducting means have a higher power rating than those of the control stage carrier means.

For example, the power stage may comprise a number of conducting tracks encapsulated in a non-conducting plastic material, the tracks being adapted to interconnect at least some of the power stage components. The conducting tracks may be provided in the form of multiple layers of conducting material, such as copper tracks. The power rating is increased by increasing the number of layers for each track or the cross-sectional area of each track.

It is most preferred that the conducting tracks and plastics material are selected such that the power stage forms a substantially rigid planar lead frame. The tracks may then be in the form of a fretwork. The lead frame may include more than one piece of fretwork. Each piece or track may be of different metals to suit different soldering or other connecting techniques. The leadframe does not need to support any of the power stage components although it could be adapted to support one or more components, such as a current capacitor.

A portion of one or more of the conducting tracks may be upstanding from the planar frame for interconnecting with tracks or components of the control stage.

In a most preferred arrangement, the first conducting means comprises a single layer fretwork of conducting tracks embedded in a plastics material. The fretwork may be stamped from a sheet of material such as copper, and placed in a mould so that the plastic material can be injection moulded around it. This produces a rigid carrier means onto which various components can be mounted. The power capacity can then be easily changed from one device to another by increasing the cross-sectional area of the fretwork whilst retaining the same mould.

The control stage preferably comprises a printed circuit board defining the second conducting means upon which the control stage components are mounted. Some or all of these low power components may be surface mounted to minimise both.

The printed circuit board most preferably comprises a four layer $1_{oz}$ circuit board. Of course, more or less layers, and different weights of tracks could be employed within the scope of the invention.

Preferably, an electromagnetic shield is provided between the first and second conducting means. The shield may comprise a conducting screen having holes or other openings through which the upstanding conductors of the power stage can pass to contact the tracks or components in the control stage, or vice versa. The electromagnetic shield provides a barrier to substanitially prevent electromagnetic radiation from one stage interfering with components of the other stage. This is preferably earthed by a low impedance conducting connection or link to a suitable earth point.

One or more of the high power devices comprising part of the power stage may be provided on a separate substrate and electrically connected to the conductors of the first conducting means. This may be by solder joints to portions of the tracks either upstanding or depending from the first conducting means.

The separate substrate may comprise a material having good thermal conducting and electrical isolation properties, such as IMS. The substrate may be directly connected to a portion of a housing of the electrical motor to dissipate heat. Alternatively, it may be directly connected to a portion of the gearbox which is provided between the motor and the first portion of shaft. The motor housing and/or gearbox therefore dissipates heat generated in the power devices without the need for a separate heatsink. Or course, a separate heatsink could be provided as well/or instead if required.

By providing the first conducting means which provides an electrical connection between components of the power stage and a second conducing means (carrying the control stage) one above the other with an electromagnetic shield between them and securing them directing onto the motor or gearbox, a compact assembly is produced which can be made relatively immune to external electromagnetic interference if the shield is directly connected to the motor or gearbox.

The electromagnetic compatibility of the assembly can be further improved by providing fixing means that co-operates with the shield to provide a mechanical connection from the control stage to the motor housing which is earthed.

Preferably, the power stage conducting means is positioned relative the motor so as to minimise the length of the conductive tracks between the motor windings and the power components such as the motor drive stage switching devices. This ensures optimum efficiency and a minimum power dissipation due to impedance of the conducting tracks or links of the carrier means.

In a most preferred arrangement, the power stage includes a motor current sense resistor which is located substantially in the plane of the conducting fretwork of the first conducting means. In this manner, there are no power conducting paths above or below the high power resistor so mutually induced inductance is minimised.

Since the motor current sense resistor is a relatively large component, placing it in the same plane as the fretwork reduces the height of the assembly. Of course, this can also be achieved when the first conducting means comprises a multi-layer circuit board by placing the resistor in the plane of the circuit board.

By being "in the plane", we mean that the axial centre of the resistor is substantially in line with a plane passing through the centre of the carrier means. However, any arrangement whereby at least part of the resistor is above and part of the resistor is below a surface of the first conducting means is envisaged.

A magnetic shield material may be provided on the first conducting means which encapsulates the sense resistor on both sides, or perhaps just one side to reduce electromagnetic interference.

The first conducting means may also carry a connector means which enables electrical connection to be made to one or more the conducting tracks or components for testing or remote operation purposes.

There will now be described by way of example only, one embodiment of the present invention with reference to the accompanying drawings of which:

Figure 1:
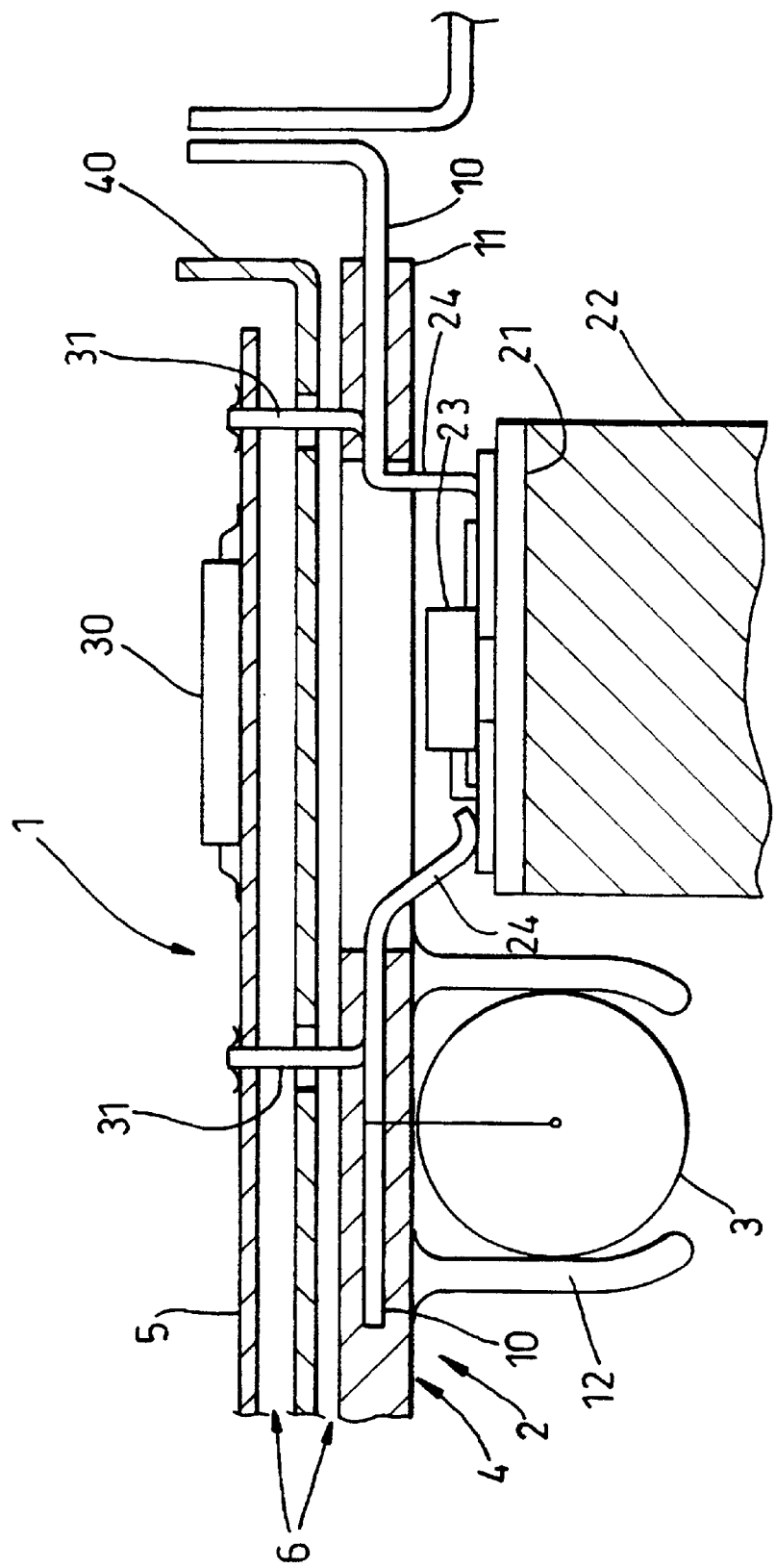
FIG. 1 is an illustration of the arrangement of the power stage, control stage and a motor in a electrical power assisted steering system in accordance with the present invention.

FIG. 1 shows a part of an electrical power assisted steering system comprising a control stage 1 adapted to produce one or more motor drive signals and a power stage 2 adapted to control current flowing in the windings of an electric motor (not shown) in response to the motor drive signals. The motor drive signal is typically processed by a control circuit to generate three motor phase voltage or current signals, one for each phase of a three phase brushless DC motor. The power circuit comprises a three phase bridge of power switching devices which are switched in response to the three motor phase signals. For high torque electric motors, the switching devices must handle high currents and dissipate high power.

As shown, at least some of the components 3 of the power circuitry 2 are provided on a first conducting means 4 and the control circuitry is provided on a second, separate, conducting means 5 positioned above the first carrier means 4 and separated therefrom by an air gap 6.

The first conducting means 4 comprises a conducting fretwork 10 of relatively thick track, for example stamped from a sheet of copper material. The fretwork is then placed in a mould and encapsulated (at least partially) by plastics 11 to form a substantially rigid assembly or leadframe, and with a vibration clip 12 forming part of the plastics 11 encapsulating the fretwork of the leadframe. Power components such as a EMC capacitor 3 are provided on the lead frame in electrical contact with the fretwork 10.

Other power devices 23 of the power circuit 2 are provided on a separate substrate 20. This comprises a high thermal conductivity, electrically insulating substrate which is mounted directly onto a thermally conducting portion of the motor housing 22. Electrical connection between the fretwork 10 of the leadframe and the power devices 23 is made by soldering the power devices 23 onto portions 24 of the fretwork depending from the plane of the lead frame.

The control stage 1 is arranged above and spaced from the power stage 2 and comprises a multi-layer printed circuit board 5 upon which the control circuit components 30 are mounted. Electrical contact between the control stage 1 and the power stage 2 is provided by connection with portions 31 of the fretwork 10 which are upstanding from the leadframe. An electromagnetic shield 40 comprising a conducting screen or mesh is provided in the air gap 6 between the leadframe and the printed circuit board to screen the control stage 1 from the power stage 2. The electrical contacts between the two stages pass through holes in the shield. The shield 40 can be connected to the motor casing earthed to chassis.

By making the fretwork 10 from relatively thick conducting material, the leadframe can be made self supporting and, as shown, the control stage 1 can be entirely supported over the power stage 2 by the upstanding portions 31 of fretwork 10 which define the electrical connections between the two stages.

Figure 2:
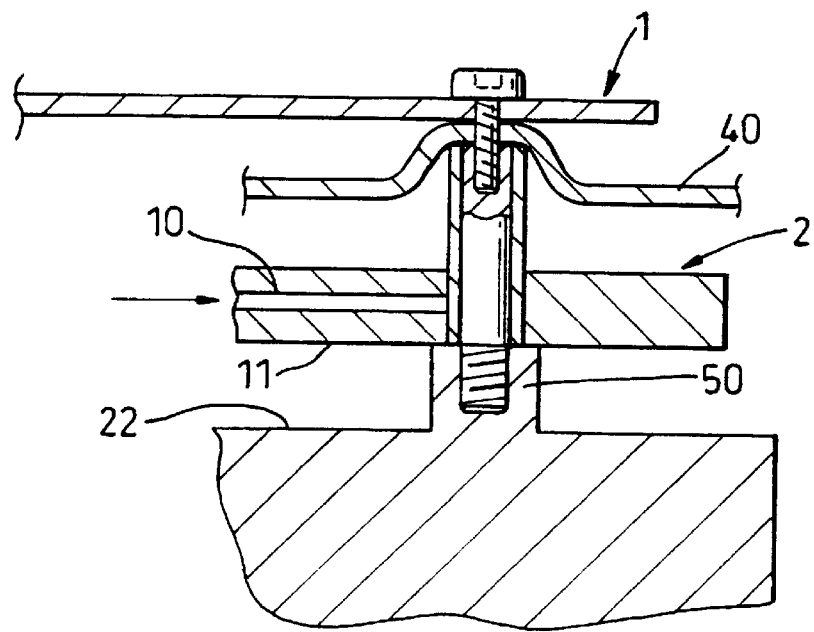
FIG. 2 is an enlarged view showing an alternative arrangement.

An alternative arrangement is shown in FIG. 2, which represents an enlarged view of a portion of the control stage 1 positioned above the power stage 2. As shown, a raised portion 50 of the chassis (i.e. motor housing) passes through the power stage lead frame to support the control stage directly. A portion of the shield 40 is clamped between the control stage and the raised portion to provide a good electrical contact by, for example, a screw or bolt in a bore raised portion 50.

Figure 3:
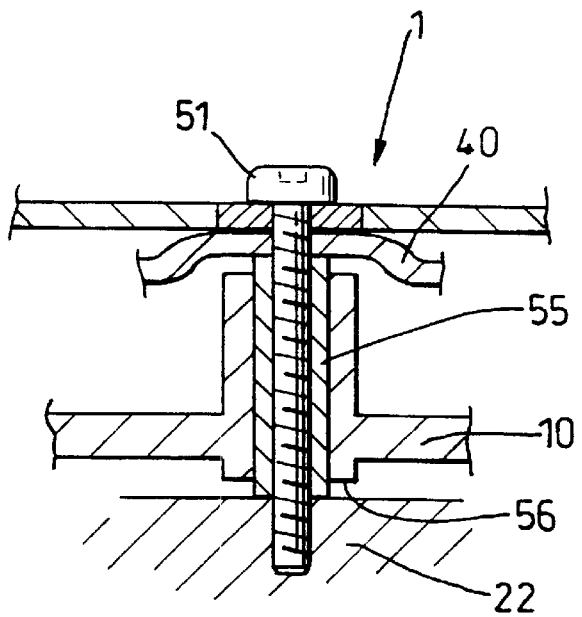
FIG. 3 shows a metallic bush being moulded into the frame.

As shown in FIG. 3 of the accompanying drawings a metallic insert bush 55 is moulded into the frame 10 and both of its ends protrude from the frame. A screw 51 clamps the board and shield of the chassis in a manner to provide a good electrical contact.

Figure 4A:
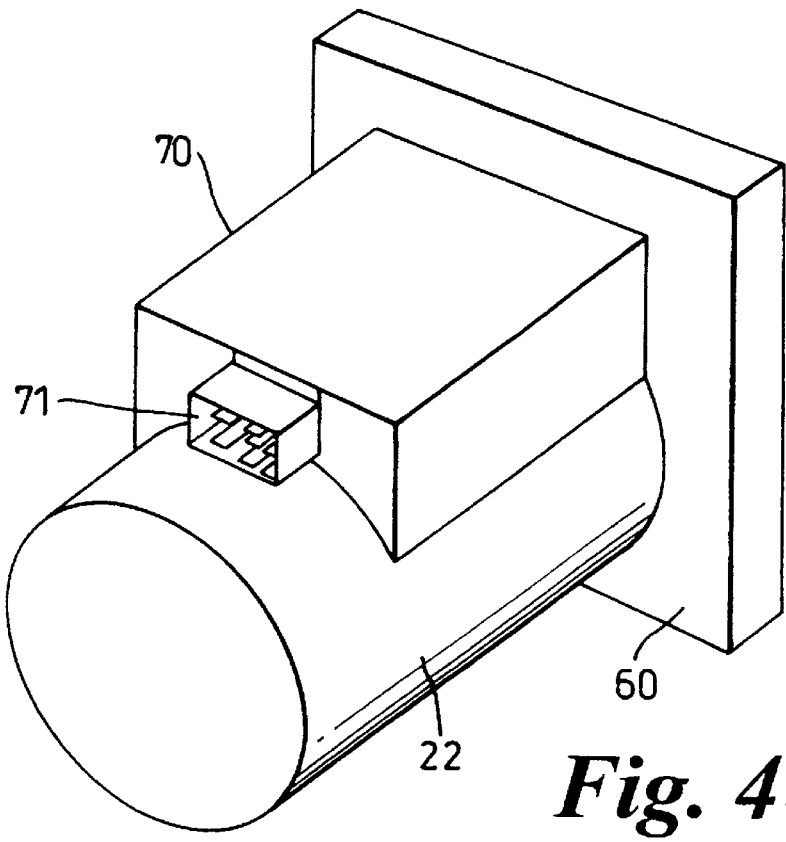
FIG. 4 shows the location of the circuitry relative to the motor.
Figure 4B:
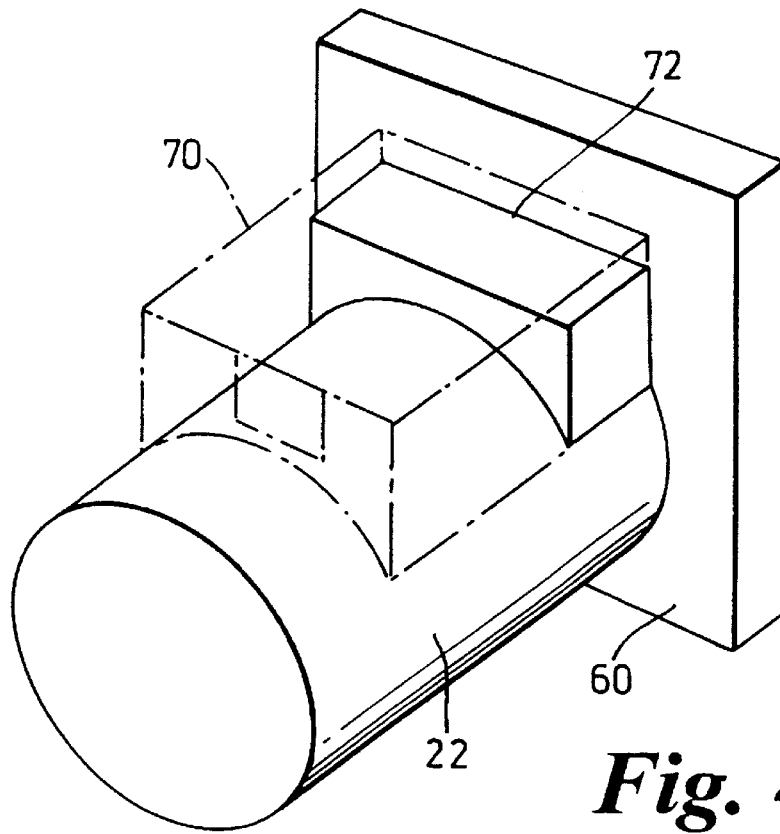

It is preferred that the motor housing 22 is made as a metal casting chassis. The metal helps to dissipate heat from the power devices. In a further refinement, as shown in FIGS. 4(a) and (b) the motor housing 22 is connected to a separate gearbox housing 60 which is also of metal. The connections from the motor windings (not shown) to the power stage are arranged close to the interface between the motor housing 22 and gearbox housing 60 so that the power devices can be located on the substrate connected to the motor housing close to the gearbox housing. At the same time the length of the connection to the windings is minimised. As can be seen from the cut-away view in FIG. 3(b), the power stage and control stage are enclosed within a housing 70 to provide immunity from external electromagnetic radiation. A connector 71 which contacts the electrical circuitry is provided in a face or the lid of the housing 70 but typically the end face as shown to enable a power supply to be connected to the circuit and feeds from other sensors or circuitry. This can be used for diagnostics. The power device and the substrate are bolted or soldered directly to a raised portion 72 of the motor housing 22 directly above the motor phase windings (not shown).

What is claimed is:

1. An electric power assisted steering system for a vehicle having a steering wheel and a road wheel, wherein the system comprises a motor, a gearbox, a first portion adapted to be operatively connected to said steering wheel, a second portion adapted to be operatively connected to said road wheel, a torque sensor adapted to provide an output signal indicative of the torque in said first portion, an electrical circuit adapted to process said output signal from said torque sensor to produce a drive signal for said motor connected through said gearbox to said second portion, and a control circuit including at least one electric component, wherein said electrical circuit comprises a power stage which comprises at least a first conducting means and a control stage comprising a second separate conducting means adapted to carry said electrical component of said control circuit, each said conducting means comprising at least one conductive track for carrying current to and/or from components of said electric power assisted steering system, and wherein an electromagnetic shield is provided between said first and second conducting means.

2. An electric power assisted steering system according to claim 1, wherein said first and second conducting means are arranged spaced apart one on top of the other.

3. An electric power assisted steering system according to claim 1, wherein said conducting track or connections of said power stage conducting means have a higher power rating than those of said control stage carrier means.

4. An electric power assisted steering system according to claim 1, wherein said power stage comprises a number of conducting tracks encapsulated in a non-conducting plastic material, said track being adapted to interconnect at least some of said power stage components.

5. An electric power assisted steering system according to claim 4, wherein said conducting tracks of said power stage comprise multiple layers of conducting material, such as copper tracks.

6. An electric power assisted steering system according to claim 4, wherein said power stage forms a substantially rigid planar lead frame with said tracks in the form of a fretwork.

7. An electric power assisted steering system according to claim 6, wherein said power stage includes a motor current sense resistor which is located substantially in the plane of said conducting fretwork of said first conducting means.

8. An electric power assisted steering system according to claim 7, wherein a portion of said conducting track of said power stage is upstanding from said planar frame for interconnecting with tracks of said control stage.

9. An electric power assisted steering system according to claim 1, wherein said control stage comprises a printed circuit board defining said second conducting means upon which said control stage components are mounted.

10. An electric power assisted steering system according to claim 1, wherein at least one high power device comprising part of said power stage is provided on a separate substrate and electrically connected to said conductors of said first conducting means.

* * * * *